US010264715B1

(12) United States Patent
Ortega Gutierrez (10) Patent No.: US 10,264,715 B1
(45) Date of Patent: Apr. 16, 2019

(54) USING WASTE HEAT FOR CLIMATE CONTROL IN RACK (71) Applicant: Amazon Technologies, Inc., Seattle, WA (US)

(72) Inventor: Felipe Enrique Ortega Gutierrez, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/839,752

(22) Filed: Dec. 12, 2017

(51) Int. Cl.
*H05K 7/20* (2006.01)

(52) U.S. Cl.
CPC ..... *H05K 7/20836* (2013.01); *H05K 7/20736* (2013.01); *H05K 7/20781* (2013.01)

(58) Field of Classification Search
CPC ............. H05K 7/20536–7/20836; G06F 1/20
USPC ................... 361/695, 699, 701, 724–727, 361/679.49–679.51; 454/184
See application file for complete search history.

(56) References Cited

U.S. PATENT DOCUMENTS

| 9,642,286 | B1* | 5/2017 | Gutierrez | H05K 7/20736 |
| 9,888,615 | B1* | 2/2018 | Frink | G11B 33/144 |
| 10,004,165 | B1* | 6/2018 | Bailey | H05K 7/20745 |
| 2011/0096503 | A1* | 4/2011 | Avery | F25B 27/02 361/701 |
| 2016/0192542 | A1* | 6/2016 | LeFebvre | H05K 7/20836 361/679.47 |
| 2018/0268861 | A1* | 9/2018 | Miranda Gavillan | G11B 23/021 |

\* cited by examiner

*Primary Examiner* — Dion Ferguson
*Assistant Examiner* — Amir A Jalali
(74) *Attorney, Agent, or Firm* — Klarquist Sparkman, LLP (57) ABSTRACT

A data center includes a rack computer system, a tape library rack module and a heat exchange circuit. The rack computer system is positioned inside the data center and is operable to provide computing capacity and generate waste heat within a first environment. The tape library rack module is positioned within the data center and comprises an enclosure that encompasses its interior, a rack within the interior, at least one tape library unit mounted on the rack within a second environment that is environmentally isolated from the first environment. The heat exchange circuit comprises a pump to circulate heat transfer fluid, a first heat exchanger that receives waste heat in the first environment from the rack computer system to warm heat transfer fluid and a second heat exchanger that releases heat from warmed heat transfer fluid into the second environment to help control the temperature and/or relative humidity of the second environment.

20 Claims, 7 Drawing Sheets

USING WASTE HEAT FOR CLIMATE CONTROL IN RACK

BACKGROUND

Organizations such as on-line retailers, Internet service providers, search providers, financial institutions, universities and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers as well as associated computer equipment and computer components.

Computer systems typically include a number of components that generate waste heat. Such components include printed circuit boards, mass storage devices, power supplies and processors. For example, some computers with multiple processors may generate 250 W of waste heat. Some known computer systems include a plurality of such larger, multiple-processor computers that are configured into rack-mounted components, and then are subsequently positioned within a rack system. Some known rack systems can include 40 such rack-mounted components in such rack systems, which will generate as much as 10 kW of waste heat. Moreover, some known data centers include multiple rack systems.

As data needs grow and change, data storage needs and data centers need to adapt. As one example, as data centers grow in complexity, two or more areas within a data center may each be operated most efficiently at environmental conditions that differ from one another.

DETAILED DESCRIPTION

Described below are various implementations of a data center that comprises a rack computer system, a tape library rack module and a heat transfer circuit. The rack computer system is positioned within a first environment inside the data center. The rack computer system is operable to provide computing capacity and generates waste heat. The tape library rack module is positioned within the first environment and comprises an enclosure that encompasses an interior of the tape library rack module, a rack within the interior and at least one tape library unit with tape cartridges mounted on the rack to store data within a second environment inside the data center. The second environment is environmentally isolated from the first environment. The heat exchange circuit comprises a pump to circulate heat transfer fluid, a first heat exchanger configured to receive waste heat in the first environment from the rack computer system to warm heat transfer fluid and a second heat exchanger configured to release heat from warmed heat transfer fluid into the second environment to help control at least one of the temperature and the relative humidity of the second environment.

In some implementations, a method of using waste heat generated within an enclosed data center to warm computing equipment comprises using waste heat generated by first computing equipment in a first space operating at first predetermined environmental conditions to warm air passing through a first heat exchanger and in turn warm a heat exchange liquid in the first heat exchanger. The warmed heat exchange liquid is circulated from the first heat exchanger to a second heat exchanger in a second space separated from the first space. The second space is within the data center and environmentally isolated from the first space. The second space houses computer equipment or other sensitive equipment. Heat is released from the second heat exchanger to the second space to warm the second space and/or decrease the relative humidity of the second space such that it is maintained at second predetermined environmental conditions different from the first predetermined environmental conditions.

According to some implementations, an apparatus includes a rack computer system, a thermally linked climate-controlled rack module and a heat exchange circuit thermally linking the rack computer system and the climate controlled rack module. The rack computer system and the climate-controlled rack module can each be positioned within a first environment. The rack computer system is operable to provide computing capacity and generates waste heat exhausted to the first environment. The climate-controlled rack module has an enclosure that defines a second environment environmentally isolated from the first environment. The second environment is configured for operating equipment requiring predetermined environmental conditions, e.g., tape drives and tape cartridges for storing data, scientific equipment, etc. The heat exchange circuit includes a pump to circulate heat transfer fluid, a first heat exchanger configured to receive waste heat in the first environment from the rack computer system to warm heat transfer fluid and a second heat exchanger configured to release heat from warmed heat transfer fluid into the second environment to help control at least one of the temperature and the relative humidity of the second environment.

Figure 1:
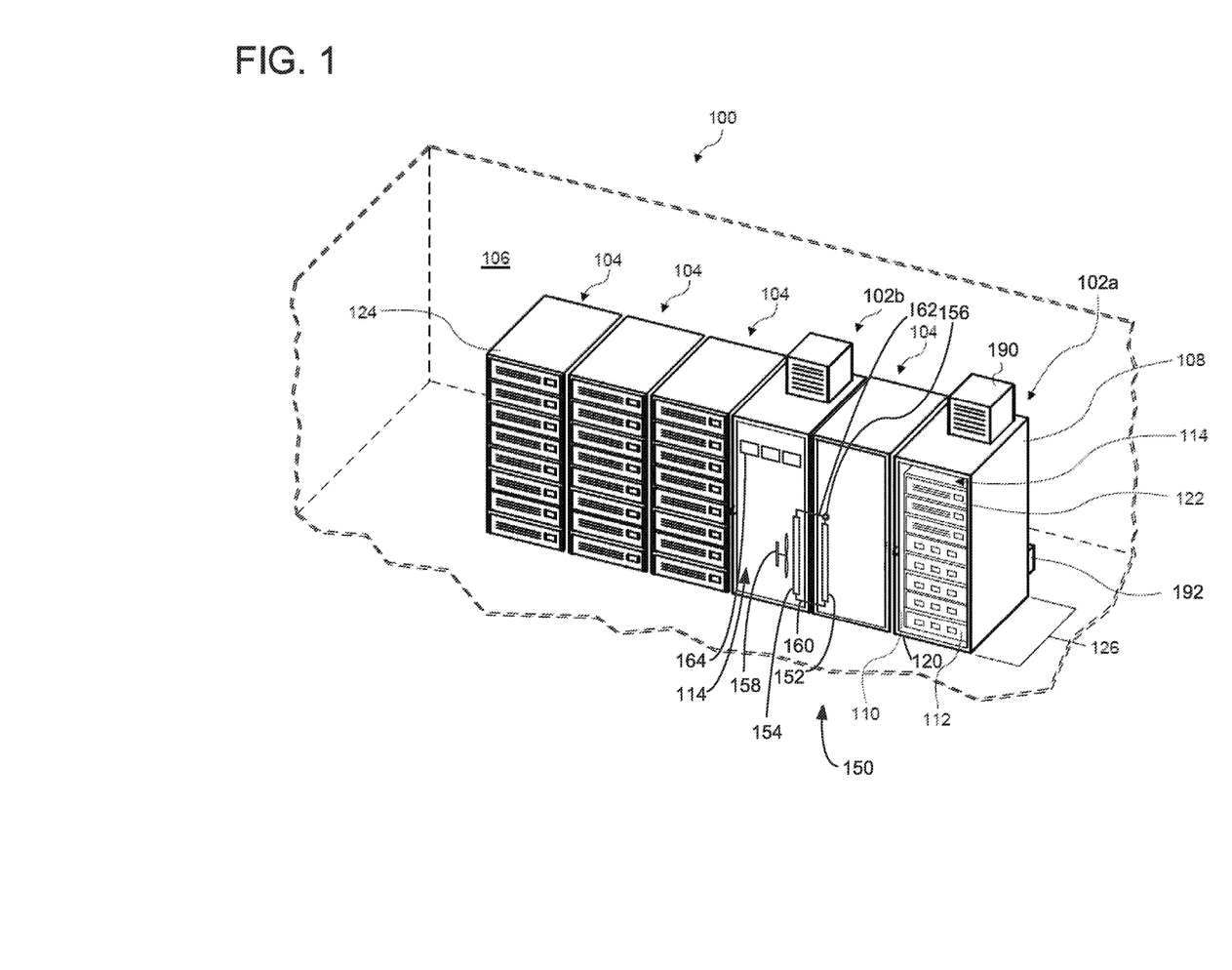
FIG. 1 is a schematic perspective view showing part of an interior of a data center having a tape library rack module and a rack computer system that are thermally connected to each other by a heat transfer circuit according to some implementations.

FIG. 1 illustrates a data center 100 that includes example tape library rack modules 102a, 102b along with rack computer systems 104, in accordance with some implementations. The rack computer systems 104 may be configured to provide computing capacity within a data center environment 106 (e.g., an environment inside a data center room). In some implementations, the data center environment 106 has one or multiple environmental parameters at which the data center 100 is maintained. For instance, the data center environment 106 may be subject to a data center temperature range and/or a data center relative humidity range. In some examples, the data center temperature range may be from 5° C. to about 40° C., and the data center relative humidity range may be from about 8% to about 85%.

With specific reference to the tape library rack module 102a shown at the end of the row 126 in FIG. 1, the tape library rack module 102 may include an enclosure 108 encompassing an interior of the tape library rack module 102, a rack 110 within the interior, and tape library units 112 mounted on the rack 110. The tape library units 112 may be within a portion of the interior that is enclosed and environmentally isolated from the data center environment 106, referred to herein as a tape environment 114. As described below in further detail, the tape environment 114 can be maintained at conditions suitable for the tape library units 112, and more particularly, tape cartridges for storing data used in conjunction with the tape library units 112. In some implementations, another separate environment for storing the tape cartridges until they are used is defined.

In some examples, the tape environment 114 has one or multiple environmental parameters at which an interior portion of the tape library rack module 102 is maintained. For instance, the tape environment 114 may have a tape temperature range and/or a tape relative humidity range. In some examples, the tape temperature range may be from about 16° C. to about 25° C., and the tape relative humidity range may be from about 20% to about 50%. In some examples, a maximum wet bulb temperature of air in the tape environment 26° C. or less. In some examples, a maximum rate of temperature change within the tape environment is 2° C. or less per hour.

With reference to the second tape library rack module 102b of FIG. 1 (which is shown with a transparent front wall), and one of the adjacent rack computer systems 104 to the right (also shown with a transparent front wall), there is a heat transfer circuit 150 that extends between and thermally connects them. The heat transfer circuit 150 includes a first heat exchanger 152 positioned within the rack computer system 104, a second heat exchanger 154 positioned within the tape environment 114 and a pump that are fluidly connected to each other with suitable fluid lines, such as the lines 160, 162, for circulating a heat exchange fluid contained therein. The environment within which the first heat exchanger is positioned, i.e., within the rack computer system 104, may be the same as the data center environment 106, or a separate environment (e.g., if the rack computer system 104 is environmentally isolated from the data center environment 106).

Additionally, there is a fan 158 (or other air mover) positioned adjacent the second heat exchanger 154 to assist in moving air past the heat exchanger to 154 to increase the rate of heat transfer. (Although not shown, there could be a fan or other air mover similarly positioned adjacent the first heat exchanger 152.) As also shown schematically in FIG. 1, there may be one or more sensors 164 positioned to detect one or more environmental conditions, such as a temperature, relative humidity and/or pressure, of a given space, such as the tape environment 114.

As described, waste heat from computing equipment, such as servers in the rack computer system 104, can be used to maintain the tape environment 114 in the tape library rack module 102 at desired conditions, e.g., to warm the air temperature to within a desired range and/or to lower the relative humidity to within a desired range. The waste heat generated in the rack computer system 104 warms the ambient air, which in turn warms the heat transfer fluid in the first heat exchanger 152. Warmed heat transfer fluid is circulated by the action of the pump 156 to the second heat exchanger 154, where heat is released from the heat transfer fluid to warm the ambient air and/or dry the ambient air in the tape environment 114.

The sensors) 164 can be linked to a control circuit (not shown in FIG. 1) such that one or more sensed parameters can be used to control operation of the heat transfer circuit 150. For example, the speed of the pump 162 and the speed of the fan 158 are two parameters that can be controlled to change the rate of heat transfer, based on the detected temperature, humidity and/or pressure within the tape environment 114. It would also be possible to enclose one or both of the heat exchangers 152, 154 within respective chambers with controllable louvers or use other arrangements to regulate the amount of heat exchanged.

In some implementations, the enclosure 108 of the tape library rack module 102 may include a top wall, a bottom wall opposite the top wall, a front wall, a rear wall opposite the front wall, a first side wall, and a second side wall opposite the first side wall. In some cases, the front wall may include a door 120 configured to provide access to the interior of the tape library rack module 102.

In some embodiments, the tape library rack module 102 may include support units 122 within the interior of the tape library rack module 102. The support units 122 may be configured to provide support to the tape library units 112. For instance, the support units 122 may include one or more servers and/or one or more switches.

In some implementations, the rack 110 of the tape library rack module 102 may be a standard rack, e.g., as specified by the Electronic Industries Association (EIA), that is 42 U high. In a particular example, each of the support units may be a 1 U in height, and the tape library units may include units that range from 1 U in height to 6 U in height. However, the sizes of the support units and/or the tape library units may vary in other implementations.

In some implementations, each of the rack computer systems 104 is at least partially enclosed by a respective enclosure 124. The enclosure 108 of the tape library rack module 102 may have a form factor that is the same as, or similar to, the enclosure 124 of the rack computer systems 104. In some examples, the enclosure 108 of the tape library rack module 102 may be shaped such that it is capable of being placed in a same rack row 126 as the rack computer systems 104.

In some implementations, other heating and/or cooling equipment is provided in addition to the heat transfer circuit 150. For example, as shown in FIG. 1, the tape library rack module 102a, 102b may include an optional cooling unit 190 configured to cool at least the interior portion of the tape library rack module 102a, 102b that includes the tape library unit 112. Additionally, or alternatively, the tape library rack module 102a, 102b may include an optional humidifier unit 192 configured to humidify at least the interior portion of the tape library rack module 102 that includes the tape library unit 112. In some examples, the cooling unit 190 may be mounted on the top wall of the enclosure 108. Furthermore, in some examples the humidifier unit 192 may be mounted on the rear wall of the enclosure 108.

The heat transfer circuit 150 can be controlled to operate in coordination with other climate control equipment, such as the cooling unit 190 and/or the humidifier unit 192, if provided. In some implementations, a single control circuit is used to control the heat transfer circuit 150, the cooling unit 190 and the humidifier unit 192. For example, if the temperature of the tape environment 114 is too high, then the heat transfer circuit 150 is operated to minimize heat transfer to the tape environment while the cooling unit 119 is operated to lower the temperature of the tape environment 114.

Figure 2A:
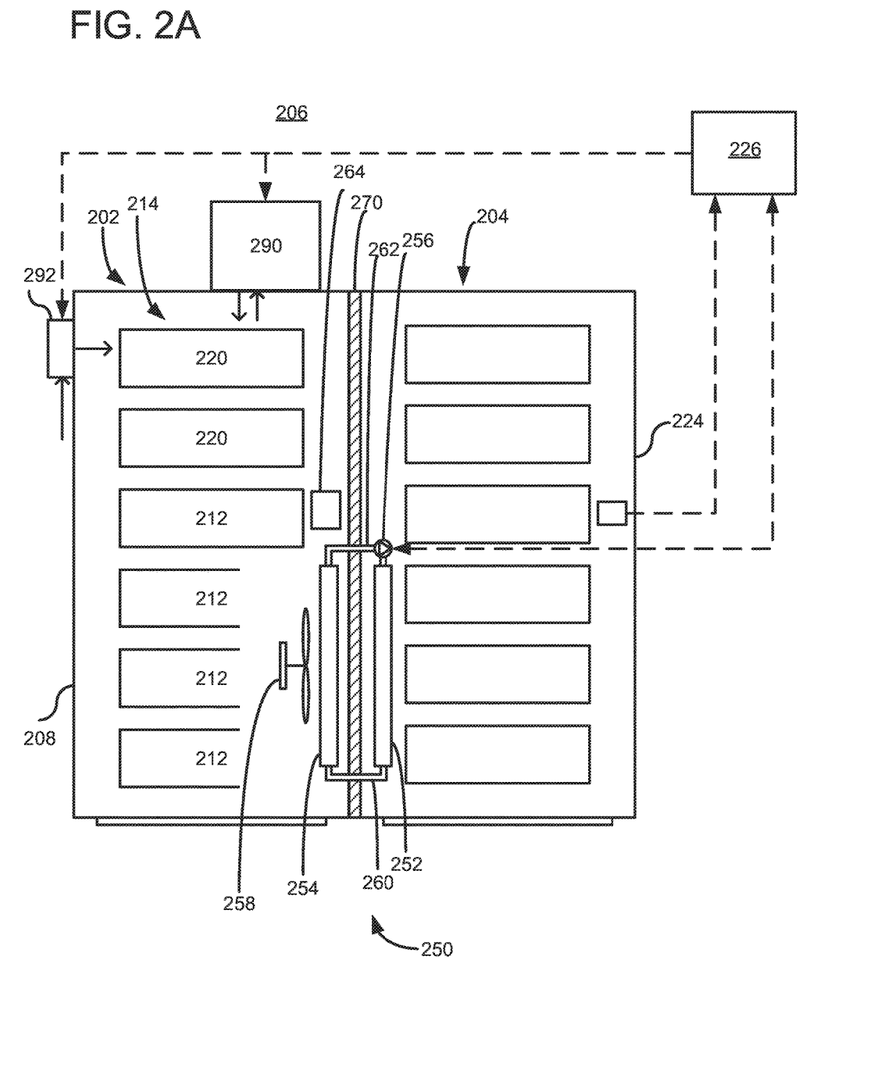
FIG. 2A is a schematic side elevation view of a tape library rack module and a rack computer system having a heat transfer circuit according to some implementations that transfers waste heat generated by the rack computer system to the environmentally isolated tape library rack module under selected conditions.

FIG. 2A is a schematic side elevation view of an example tape library rack module 202 and an adjacent rack computing system 204 that share a heat exchange circuit 250. In general, elements in FIG. 2A corresponding to elements in FIG. 1 are given the same reference numeral, plus 100.

The tape library rack module 202 is shown at the left side of FIG. 2A, and the rack computing system 204 is shown at the right side and positioned close to or in contact with a side of the tape library rack module. Optionally, there may be one or more layers of insulation 270 provided between the rack computing system 204 (which can operate within a broader temperature range) and the tape library rack module 202 to assist in environmentally isolating the tape rack library module 202.

In the example of FIG. 2A, and similar to the example of FIG. 1, the tape environment 214 is defined as substantially the entire interior of the tape library rack module 202, which is occupied by four tape library units 212 and two support units 220 as shown. The first heat exchanger 252 and the second heat exchanger 254 are preferably designed as air-to-liquid heat exchangers having an air side heat exchange surface surrounding a liquid side conduit in which a heat exchange liquid, e.g., water or a water mixture, is circulated.

As one representative operating example, the first heat exchanger 252 can be sized to have a heat capacity of 500 W per 1 U component space. Various factors affecting the required heat capacity include but are not limited to the temperature difference between ambient air at the first heat exchanger 252 (which may be in the range of 5-45° C.) and a target air temperature of the tape environment 214 (which needs to be maintained in the range of 16-25° C.), component efficiencies, line losses, air leakage from enclosures, radiation effects, etc.

As shown in FIG. 2A, the fan 258 can be positioned to facilitate heat exchange from the second heat exchanger 254 by moving cooler ambient air in the tape environment 214 over the surface of the heat exchanger 254 (such as in a cross flow or counter flow direction) to cause the air to increase in temperature. As a result or transferring heat to the air, the heat exchange liquid has reduced heat as it completes a circuit and returns to the heat exchanger 252 under the action of the pump.

The fan 258 can be a fan specific to the heat transfer circuit 250, or the fan 258 can be a part of another existing climate control unit, such as, e.g., the cooling unit 290 or the humidifier unit 292.

The enclosure 208 of the tape library rack module 202 is constructed sufficient to environmentally isolate the tape environment 214 from its surroundings, such as the data center environment 206 and any separate environment of the rack computing system 204. As used herein, "environmentally isolate" means that environmental conditions in the tape environment can be maintained at desired levels different from levels outside of the tape environment within accepted parameters, such as within predefined environmental differences and/or predefined time periods. At the same time, the enclosure 208 allows for operation of equipment housed therein, including proper air flow requirements, if applicable.

Figure 2B:
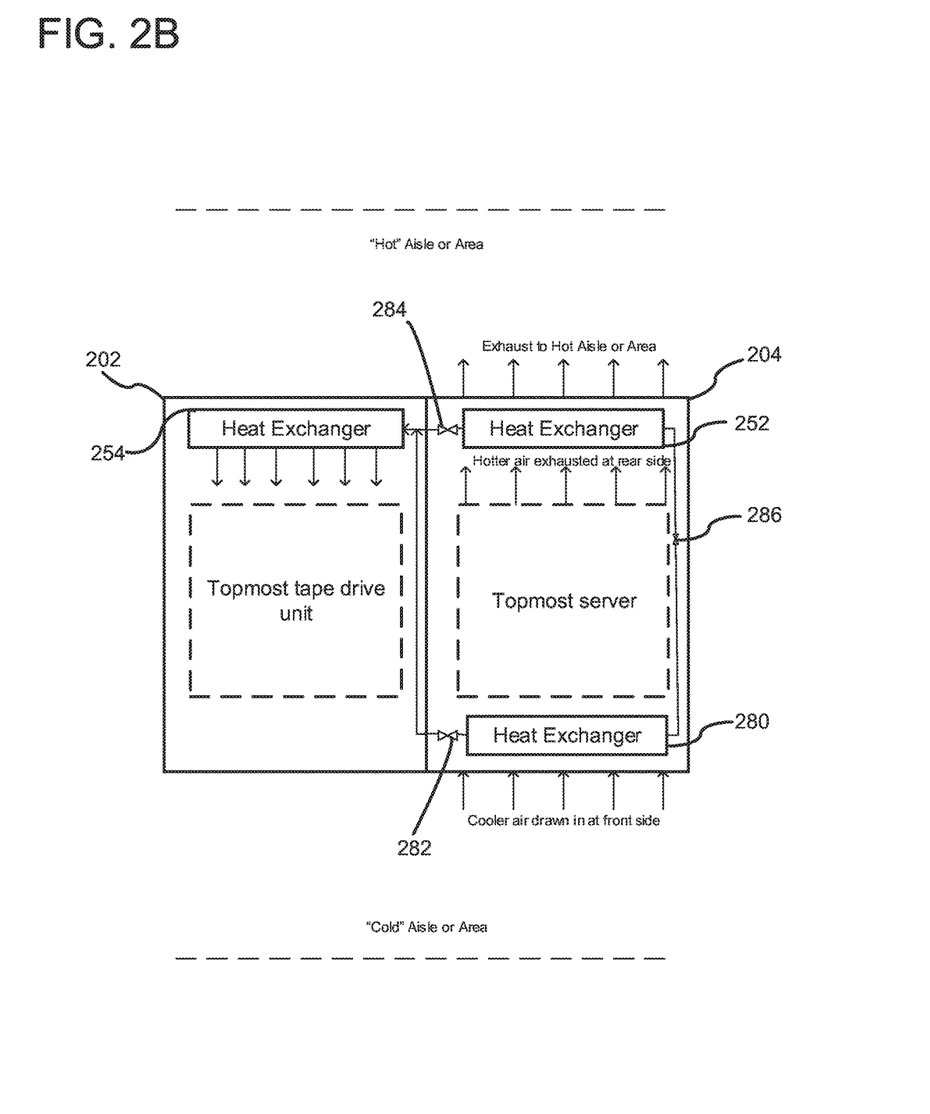
FIG. 2B is a schematic top plan view of a tape library rack module and a rack computer system showing a representative heat transfer circuit from above.

FIG. 2B is a schematic top plan view of the tape library rack module 202 and the adjacent rack computing system 204, also sometimes referred to as two "modules." As shown in FIG. 2B, these two modules 202, 204 can be situated in a data center such that their front sides are facing a "cold" aisle and their rear sides are facing a "hot" aisle. Within the rack computing system 204, a topmost one of a number of servers is shown schematically. As shown by the arrows, cooler air from the cold aisle side is drawn into the rack computing system 204 and tends to be warmed as it passes over and through the servers or other computing equipment in the rack before it is exhausted to the hot aisle. In one implementation, the warmed or "hotter" air exiting the servers is directed as shown by the arrows into contact with the heat exchanger 252, releasing heat from the warmed air to warm the heat exchange fluid. The warmed heat exchanger fluid circulates from the heat exchanger 252 to the heat exchanger 254 in the tape library rack module. Heat is released from the heat exchange fluid in the heat exchanger 252 and tends to warm and/or dry the air surrounding it or circulated over it. As a result, the environment in the module 202 is heated and/or dried to meet the operating requirements of the equipment therein, such as the tape drive units or other equipment with specific environmental requirements.

In another implementation, an optional heat exchanger, such as the heat exchanger 280, is positioned such that cool air drawn into the rack computer system 204 tends to cool heat exchange fluid in the heat exchanger 280. For example, the heat exchanger 280 can be positioned near a front or forward side of the rack computer system 204, which is near the cold aisle. The cooled heat exchange fluid can be circulated to the heat exchanger 254 to provide cooling of the module 202 under appropriate conditions.

In some implementations, the heat exchanger 280 is provided together with the heat exchanger 252, and respective valves 282, 284 are used to control the flow of heat exchange fluid to the heat exchanger 254. Typically, the valve 284 would be open and the valve 282 would be closed when the heat exchanger 252 is operating. Conversely, the valve 282 and the valve 284 would be closed when the heat exchanger 280 is operating. In some implementations, the heat exchanger 252 and the heat exchanger 280 can be connected, including with a valve 286, to provide additional options for providing heat or cooling. The valves 282, 284 and/or 286 can be connected to the control circuit such that they can be controlled to provide suitable heating or cooling based on a sensed condition in the tape library rack module 202.

In another example, the servers or other equipment that is the source of heat in the rack computer system or module (such as the rack computer system 204) are cooled using a liquid heat transfer system. In these cases, the liquid of the heat transfer system that is warmed by heat from the servers or other equipment can be circulated to the climate-controlled module (such as the tape library rack module 202) to release heat therein, such as by transfer of heat from the liquid to surrounding air, such as through the heat exchanger 254. In these cases, it may be possible to omit the separate heat exchanger 252.

Figure 3:
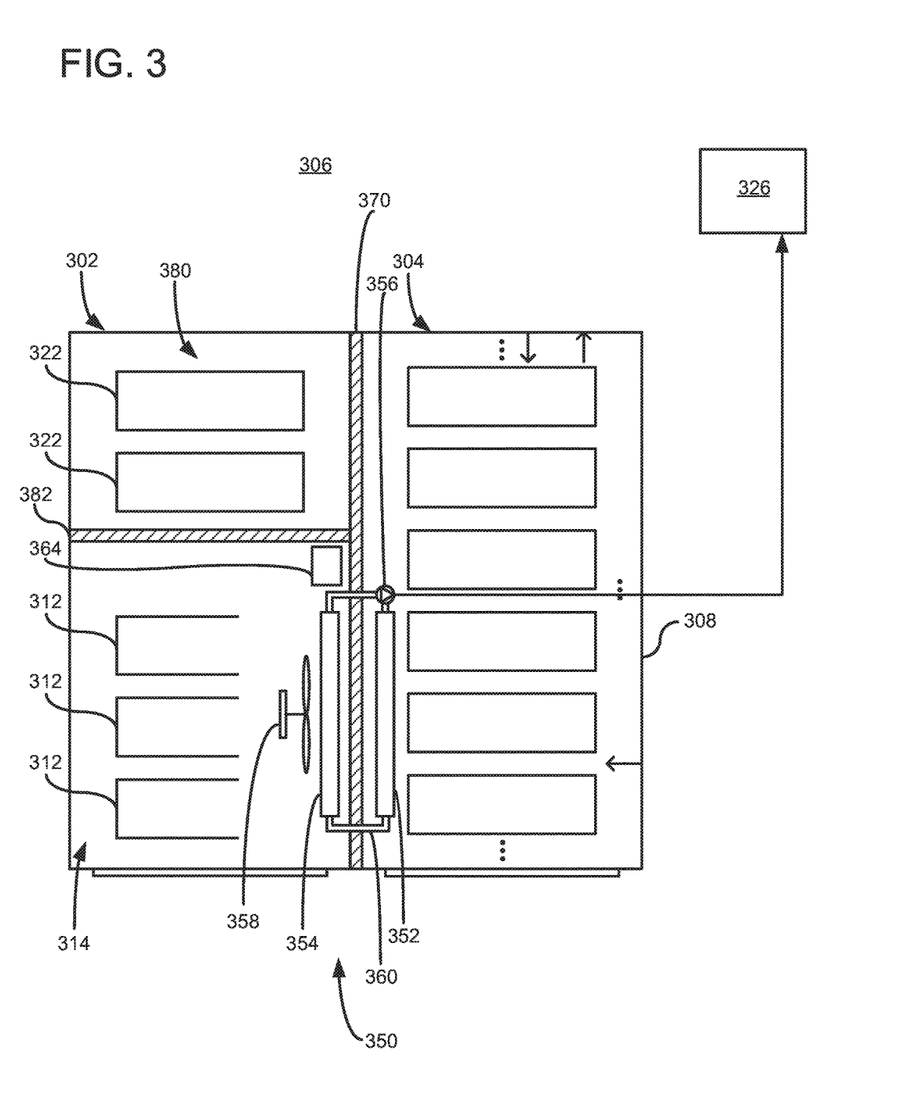
FIG. 3 is a schematic side elevation view similar to FIG. 2A except that the tape library rack module in some implementations includes an interior environmentally isolated portion separated by a partition.

FIG. 3 is a schematic side elevation view of another example tape library rack module 302 and an adjacent rack computing system 304 that share a heat exchange circuit 350. In general, elements in FIG. 3 corresponding to elements in FIG. 1 are given the same reference numeral, plus 200.

In the example of FIG. 3, the tape rack library module 302 has an interior portion 380 that is environmentally isolated from the tape environment 314, such as by a partition 382. In the illustrated example, the partition 382 extends horizontally to separate the interior portion 380 located above from the tape environment 314 located below. The tape environment 314 in the example of FIG. 3 houses only tape library units 312 and not support units 322. The support units 322 are instead housed in the separate interior portion 380. In this way, the support units 322 can be operated within the wider range of environmental conditions that they can withstand, and are not subject to the narrower range of environmental conditions required by the tape library units 312. In addition, the thermal effects from the operation of the support units 322 on the tape environment 314 are reduced compared to the arrangement in FIG. 2A. The partition 382 can include insulation as shown, or it may be uninsulated. The controller 326 receives signals from the sensor(s) 364 of one or more environmental conditions in the tape environment 314, and is connected to send control signals to the fan 358 and/or the pump 356.

Figure 4:
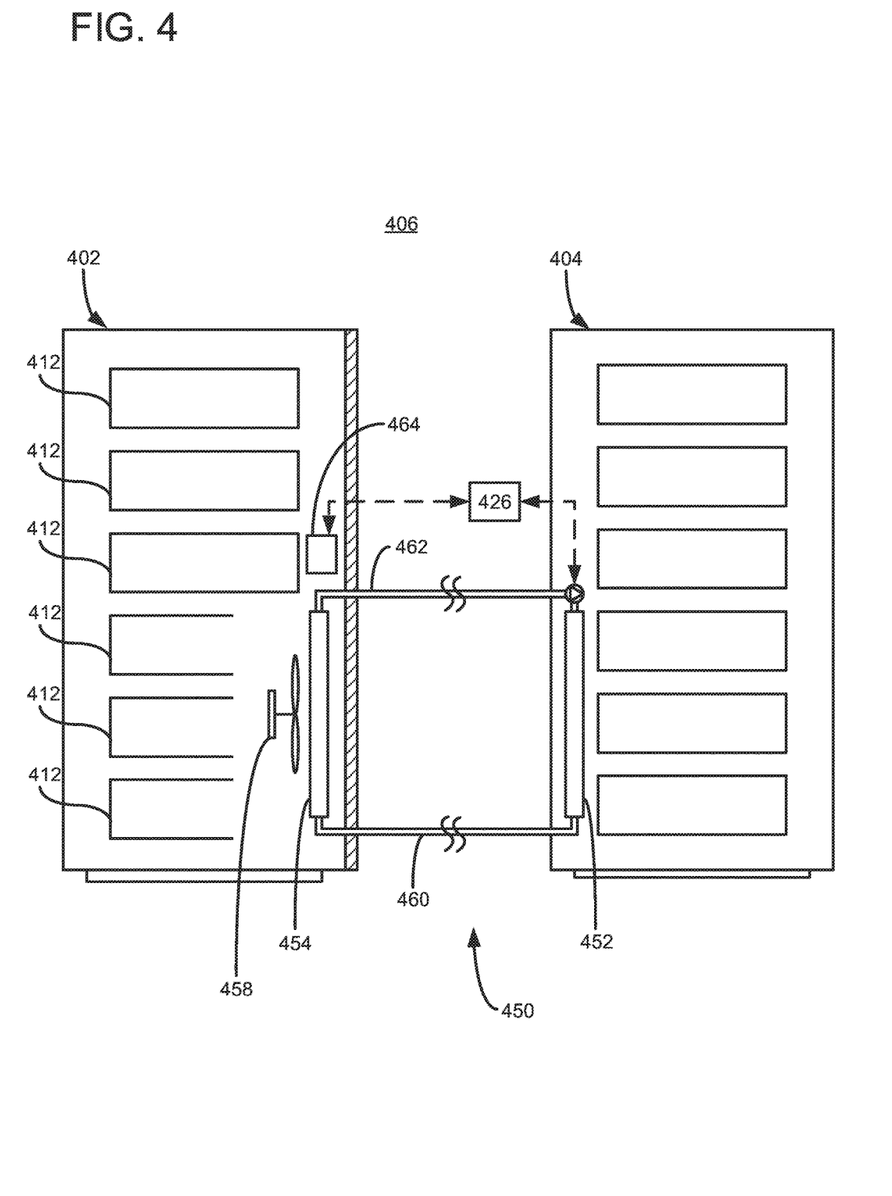
FIG. 4 is a schematic side elevation view similar to FIG. 2A except that the tape library rack module and the rack computer system are spaced apart from each other and the heat exchanger circuit has lines spanning the separating distance between them.

FIG. 4 is a schematic side elevation view of another example tape library rack module 402 and a rack computing system 404 that share a heat exchange circuit 450. In general, elements in FIG. 4 corresponding to elements in FIG. 1 are given the same reference numeral, plus 300.

In the example of FIG. 4, the tape rack library module 402 and the rack computer system 404 are spaced apart from each other, rather than being positioned adjacent to each other. Therefore, the lines 460, 462 that connect the heat exchangers 452, 454 and the pump 456 within the heat exchange circuit 450 extend to span the separating distance. In the illustration of FIG. 4, the lines 460, 462 extend through a space, but it would be possible to have the lines 460, 462 extend through or around other unrelated equipment positioned between the tape rack library module 402 and the rack computer system 404. Depending upon the distance that the lines 460, 462 must extend, one or more sections thereof may be fitted with insulation to reduce line losses. The controller 426 receives signals from the sensor 464 of one or more environmental conditions in the tape environment 414, and is connected to send control signals to the fan 458 and/or the pump 456.

Figure 5:
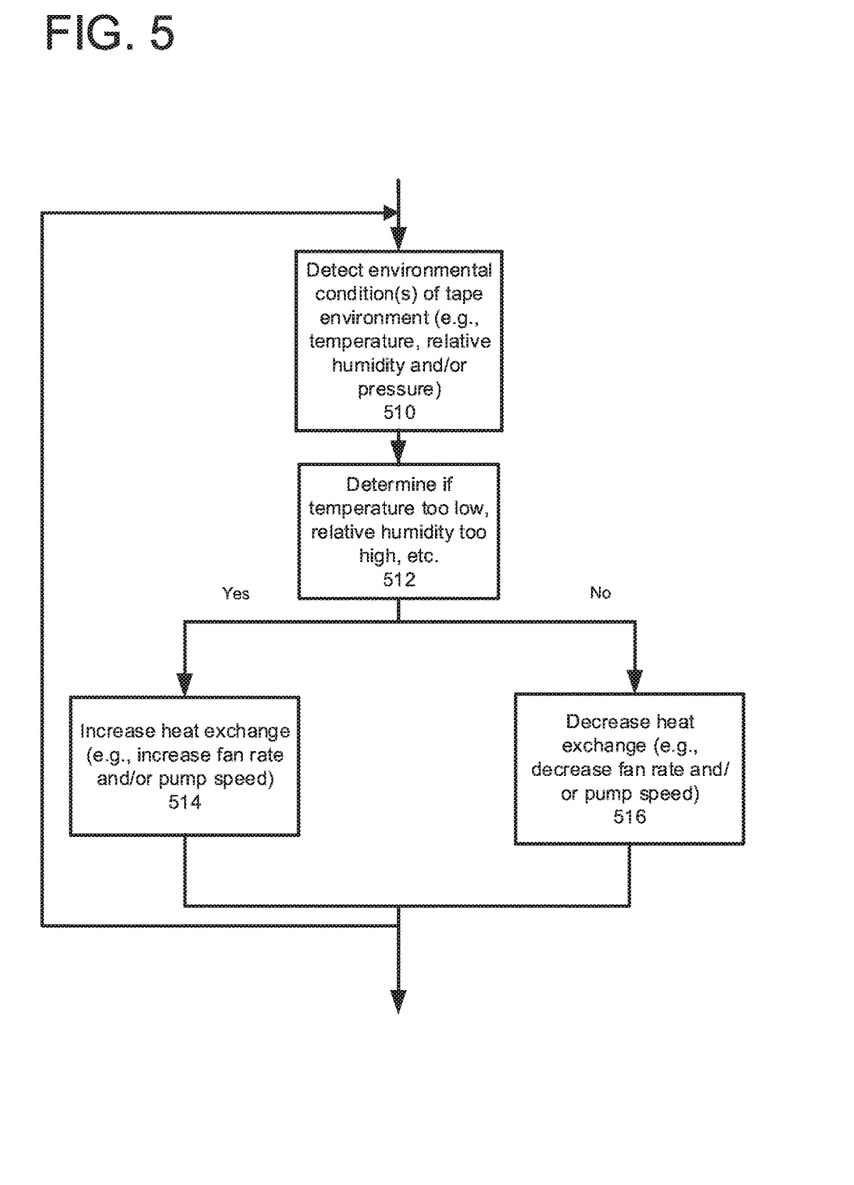
FIG. 5 is a flow chart of an example method of using waste heat to maintain environmental conditions in the tape environment within a selected range(s) using sensed conditions and a feedback control loop.

FIG. 5 is a flow chart of a method of using waste heat from computing equipment in a first space and a heat exchange circuit to control or maintain environmental conditions in a separate second space, e.g., a tape environment. At 510, one or more environmental conditions of the tape environment are detected. For example, the temperature, relative humidity and/or pressure of the tape environment can be detected, such as with one or more sensors. At 512, it is determined if the temperature, the relative humidity in the tape environment and/or another environmental condition(s) is within an acceptable range. As examples, in some implementations, the tape environment temperature range may be from 16° C. to 25° C., the tape environment relative humidity range may be from 20% to 50%, a maximum wet bulb temperature of air in the tape environment may be 26° C. or less, and/or a maximum rate of temperature change within the tape environment is 2° C. to 5° C. or less per hour. If it is determined, e g that the temperature in the tape environment is too low, or that the relative humidity in the tape environment is too high, then at 514 the control approach causes the heat transfer circuit to be operated to increase heat delivered to the tape environment. For example, the controller can transmit control signals to increase the fan rate and/or increase the pump rate. If it is determined that the temperature in the tape environment is too high, or if the relative humidity is too low, then at 516 the control approach causes the heat transfer circuit to be operated to decrease heat delivered to the tape environment. For example, the controller can transmit control signals to decrease the fan rate and/or decrease the pump rate. The process can be repeated in a feedback control loop as shown so that environmental conditions in the tape environment are controlled as desired.

Figure 6:
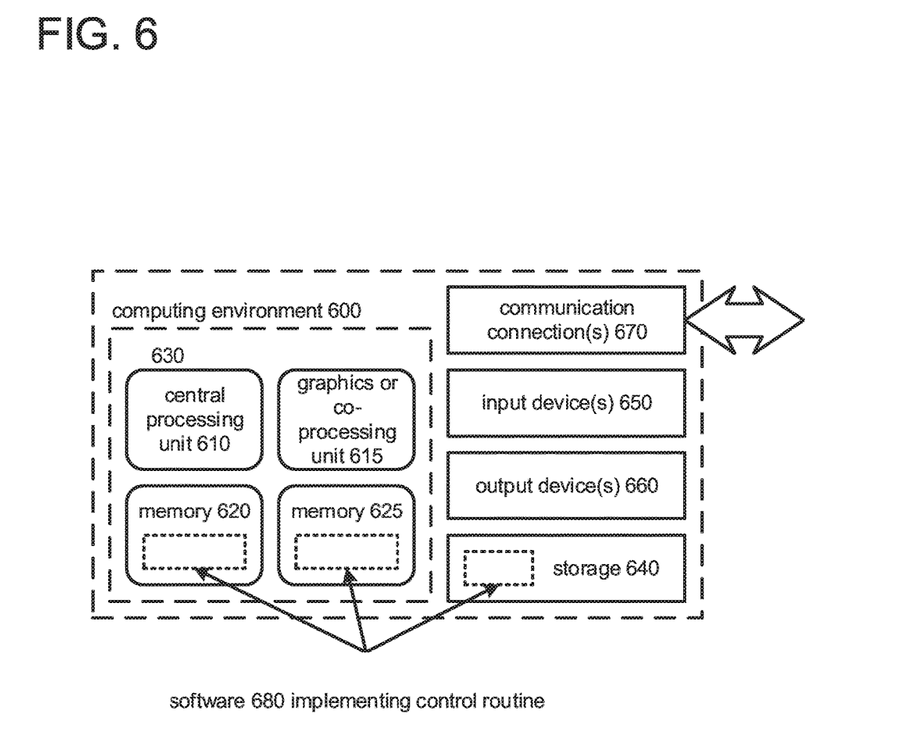
FIG. 6 depicts a generalized example of a suitable computing environment in which the described innovations may be implemented.

FIG. 6 depicts a generalized example of a suitable computing environment 600 in which the described innovations, including, e.g., the control approach and the controllers, may be implemented. The computing environment 600 is not intended to suggest any limitation as to scope of use or functionality, as the innovations may be implemented in diverse general-purpose or special-purpose computing systems. For example, the computing environment 600 can be any of a variety of computing devices (e.g., desktop computer, laptop computer, server computer, tablet computer, etc.).

With reference to FIG. 6, the computing environment 600 includes one or more processing units 610, 615 and memory 620, 625. In FIG. 6, this basic configuration 630 is included within a dashed line. The processing units 610, 615 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s). The memory 620, 625 stores software 680 implementing one or more innovations described herein, e.g., instructions to monitor and control the heat exchange circuit and related equipment, in the form of computer-executable instructions suitable for execution by the processing unit(s).

A computing system may have additional features. For example, the computing environment 600 includes storage 640, one or more input devices 650, one or more output devices 660, and one or more communication connections 670. An interconnection mechanism (not shown) such as a bus, controller, or network interconnects the components of the computing environment 600. Typically, operating system software (not shown) provides an operating environment for other software executing in the computing environment 600, and coordinates activities of the components of the computing environment 600.

The tangible storage 640 may be removable or non-removable, and includes magnetic disks, magnetic tapes or cassettes, CD-ROMs, DVDs, or any other medium which can be used to store information in a non-transitory way and which can be accessed within the computing environment 600. The storage 640 stores instructions for the software 680 implementing one or more innovations described herein.

The input device(s) 650 may be a touch input device such as a keyboard, mouse, pen, or trackball, a voice input device, a scanning device, or another device that provides input to the computing environment 600. The output device(s) 660 may be a display, printer, speaker, CD-writer, or another device that provides output from the computing environment 600.

The communication connection(s) 670 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of software-based implementations are described. Other details that are well known in the art are omitted. For example, it should be understood that the disclosed technology is not limited to any specific computer language or program. For instance, the disclosed technology can be implemented by software written in C++, Java, Perl, any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

As used herein, "computing device" includes any of the various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit (ASIC), and other programmable circuits, and these terms are used interchangeably herein. Some examples of computing devices include E-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disc (MOD), and/or a digital versatile disc (DVD) may also be used. Also, additional input channels may include computer peripherals associated with an operator interface such as a mouse and a keyboard. Alternatively, other computer peripherals may also be used such as, for example, a scanner. Furthermore, in some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulation, power distribution and control, and operational control.

As used herein, a "module" means a component or a combination of components physically coupled to one another. A module may include functional elements and systems, such as computer systems, racks, blowers, docks, power distribution units, fire suppression systems, and control systems, as well as structural elements, such as a frame, housing or container. In some embodiments, a module is prefabricated at a location off-site from a data center.

As used herein, a "rack" means a rack, container, frame or other element or combination of elements that can contain or physically support one or more computing devices paragraph as used herein, "room" means a room or a space of a building. As used herein, "computer room" means a room of a building in which computer systems, such as rack-mounted servers, are operated. As used herein, a "space" means a space, area or volume.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We therefore claim as our invention all that comes within the scope of these claims.

The invention claimed is:

1. A data center, comprising:
a rack computer system positioned inside the data center, the rack computer system being operable to provide computing capacity and generating waste heat within a first environment;
a tape library rack module positioned inside the data center and comprising:
an enclosure that encompasses an interior of the tape library rack module;
a rack within the interior of the tape rack module;
at least one tape library unit with tape cartridges mounted on the rack to store data within a second environment that is environmentally isolated from the first environment; and
a heat exchange circuit comprising a pump to circulate heat transfer fluid, a first heat exchanger configured to receive waste heat from the rack computer system in the first environment to warm heat transfer fluid, and a second heat exchanger configured to release heat from warmed heat transfer fluid into the second environment to help control at least one of the temperature and the relative humidity of the second environment.

2. The data center of claim 1, further comprising a controller linked to the pump and operable to cause the pump to operate based on a predetermined condition.

3. The data center of claim 2, wherein the pump is configured to operate at a variable pump rate, and wherein the controller controls the pump rate based on a temperature, a pressure, or a relative humidity within the second environment.

4. The data center of claim 1, further comprising a fan positioned to increase airflow through the second heat exchanger to increase release of heat from the exchange fluid to the second environment.

5. The data center of claim 1, wherein the tape library rack module comprises a humidifier unit operable to control a relative humidity of the second environment, and wherein operation of the heat exchange circuit is coordinated with operation of the cooling unit.

6. A method of using waste heat, comprising:
using waste heat generated by first computing equipment, in a first space in a data center, operating at first predetermined environmental conditions to transfer heat via a heat exchange in which a source of heat is a liquid warmed in the first space by the first computing equipment;
circulating the warmed liquid from the first space to a heat exchanger in a second space separated from the first space, the second space being within the data center and environmentally isolated from the first space, the second space housing second computing equipment; and releasing heat from the heat exchanger to the second space to warm the second space or decrease a relative humidity of the second space such that the second space is maintained at second predetermined environmental conditions different from the first predetermined environmental conditions.

7. The method of claim 6, wherein the second computing equipment comprises tape drives and tapes with computer data, further comprising maintaining an air temperature in the second space within a range from 16° C. to 25° C.

8. The method of claim 6, wherein the second computing equipment comprises tape drives and tapes with computer data, further comprising maintaining a relative humidity within the second space within a range from 20% to 50%.

9. The method of claim 6, wherein the second computing equipment comprises tape drives and tapes with computer data, further comprising maintaining a maximum wet bulb temperature of air in the second space at 26° C. or less.

10. The method of claim 6, wherein the second computing equipment comprises tape drives and tapes with computer data, further comprising maintaining a rate of temperature change within the second space at 2° C. or less per hour.

11. The method of claim 6, wherein the second computing equipment comprises tape drives and tapes with computer data, further comprising maintaining a rate of relative humidity change within the second space at 5% or less per hour.

12. An apparatus, comprising:
a rack computer system for positioning within a first environment, the rack computer system being operable to provide computing capacity;
a climate-controlled rack module for positioning within the first environment, the climate-controlled rack module having an enclosure that defines a second environment environmentally isolated from the first environment; and
a heat exchange circuit thermally linking the rack computer system and the climate-controlled rack module, the heat exchange circuit comprising a pump to circulate heat transfer fluid, a first heat exchanger configured to receive thermal energy in the first environment from the rack computer system to warm or cool heat transfer fluid and a second heat exchanger configured to receive the warmed or cooled heat transfer fluid to release heat into or cool the second environment to help control at least one environmental condition therein.

13. The apparatus of claim 12, wherein the heat transfer fluid is a heat transfer liquid, and wherein the first and second heat exchangers comprise respective first and second liquid-air heat exchangers each having a liquid side through which the heat transfer liquid is circulated and an air side by which heat is transferred to and from the heat transfer liquid, respectively.

14. The apparatus of claim 12, wherein the enclosure of the climate-controlled rack module within which the second environment is defined comprises a partition separating the second environment from another space within the climate-controlled rack module.

15. The apparatus of claim 12, wherein the rack computer system and the climate-controlled rack module are positioned adjacent each other and separated by at least one layer of insulation.

16. The apparatus of claim 12, wherein the rack computer system and the climate-controlled rack module are spaced apart from each other, and wherein the heat exchange circuit comprises fluid lines interconnecting the first heat exchanger positioned closer to the rack computer system and the second heat exchanger positioned in the second environment.

17. The apparatus of claim 12, wherein the heat exchange circuit comprises a sensor to detect a temperature, a pressure, or a relative humidity of the second environment.

18. The apparatus of claim 12, wherein the heat exchange circuit is linked to a controller via a control circuit, and wherein the controller is configured to controllably operate the heat exchange circuit to maintain the environmental condition in the second environment within a predetermined range.

19. The data center of claim 12, wherein the climate-controlled rack module comprises a cooling unit operable to cool the second environment, and wherein operation of the heat exchange circuit is coordinated with operation of the cooling unit.

20. The apparatus of claim 12, wherein the first heat exchanger is configured to receive heat in the first environment and to transfer heat to the second environment, further comprising a third heat exchanger positioned in the first environment and configured to provide cooling to the second environment.

\* \* \* \* \*